(12) United States Patent
Cai et al.

(10) Patent No.: US 8,466,473 B2
(45) Date of Patent: Jun. 18, 2013

(54) STRUCTURE AND METHOD FOR VT TUNING AND SHORT CHANNEL CONTROL WITH HIGH K/METAL GATE MOSFETS

(75) Inventors: Jin Cai, Cortlandt Manor, NY (US); Xiangdong Chen, Poughquag, NY (US); Xinlin Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 12/960,589

(22) Filed: Dec. 6, 2010

(65) Prior Publication Data

US 2012/0138953 A1    Jun. 7, 2012

(51) Int. Cl.
*H01L 31/0312* (2006.01)
*H01L 31/0328* (2006.01)
*H01L 31/0336* (2006.01)
*H01L 31/072* (2012.01)
*H01L 31/109* (2006.01)
*H01L 21/8238* (2006.01)

(52) U.S. Cl.
USPC 257/77; 257/190; 257/E21.632; 257/E27.062; 438/199

(58) Field of Classification Search
USPC ...... 257/77, 190, E21.632, E27.062; 438/199
See application file for complete search history.

(56) References Cited

U.S. PATENT DOCUMENTS

| 7,023,055 | B2  | 4/2006  | Ieong et al.           |
|-----------|-----|---------|------------------------|
| 7,211,490 | B2* | 5/2007  | Doris et al. ... 438/300 |
| 7,329,923 | B2  | 2/2008  | Doris et al.           |
| 7,348,629 | B2* | 3/2008  | Chu et al. ... 257/332  |
| 7,425,497 | B2* | 9/2008  | Chudzik et al. ... 438/591 |
| 7,432,567 | B2* | 10/2008 | Doris et al. ... 257/407 |
| 2005/0116290 | A1 | 6/2005 | de Souza et al.        |

* cited by examiner

*Primary Examiner* — David S Blum
(74) *Attorney, Agent, or Firm* — Scully, Scott, Murphy & Presser, P.C.; H. Daniel Schnurmann

(57) ABSTRACT

A semiconductor device is provided that includes a semiconductor substrate having a well region located within an upper region thereof. A semiconductor material stack is located on the well region. The semiconductor material stack includes, from bottom to top, a semiconductor-containing buffer layer and a non-doped semiconductor-containing channel layer; the semiconductor-containing buffer layer of the semiconductor material stack is located directly on an upper surface of the well region. The structure also includes a gate material stack located directly on an upper surface of the non-doped semiconductor-containing channel layer. The gate material stack employed in the present disclosure includes, from bottom to top, a high k gate dielectric layer, a work function metal layer and a polysilicon layer.

25 Claims, 4 Drawing Sheets

STRUCTURE AND METHOD FOR VT TUNING AND SHORT CHANNEL CONTROL WITH HIGH K/METAL GATE MOSFETS

BACKGROUND

The present disclosure relates to a semiconductor structure and a method of fabricating the same. More particularly, the present disclosure relates to a semiconductor structure including at least one field effect transistor (FET) having a high k/metal gate stack located on a semiconductor substrate, wherein the at least one FET has a desired threshold voltage value, improved short channel control, improved inversion carrier mobility and reduced external resistance. The present disclosure also provides a method of forming such a semiconductor structure.

One trend in modern integrated circuit manufacture is to produce semiconductor devices, such as field effect transistors (FETs), which are as small as possible. In a typical FET, a source and a drain are formed in an active region of a semiconductor substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

In order to continue scaling of semiconductor devices, high k/metal gate stacks have been employed to reduce the effective gate dielectric thickness and gate leakage. However, higher threshold voltage Vt (due to an undesirable metal gate work function) and higher capacitance are concerns for high performance complementary metal oxide semiconductor (CMOS) applications. The above concerns are especially prevalent in p-type FETs in which no stable band edge metal gate is presently available.

SUMMARY

The present disclosure provides a semiconductor structure including at least one field effect transistor (FET) having a high k/metal gate stack located on a semiconductor substrate. The FET that is provided in the present disclosure has a desired threshold voltage value, improved short channel control, improved inversion carrier mobility and reduced external resistance. The present disclosure also provides a method of forming such a semiconductor structure.

For example, and in one embodiment of the present disclosure, a desired pFET threshold voltage can be achieved with a mid-gap work function gate stack, a SiGe channel and a super steep retrograded well (SSRW). In particular, the threshold voltage is centered for a mid-gap metal gate high k pFET by using a SiGe channel (Vt shift is around 300 mV) and a SSRW (Vt shift around 200 mV, without degrading short channel effects). No doping or counter-doping is needed in the SiGe channel to center the threshold voltage, therefore Vt variations are reduced, inversion carrier mobility is enhanced and external resistance is reduced. Applicants have determined that a desired threshold voltage can be achieved for a pFET using a combination of a mid-gap work function gate stack, a SiGe channel and a SSRW. Applicants have further determined that the desired threshold voltage for a pFET is difficult to achieve in cases in which only one of a mid-gap work function gate stack, a SiGe channel and a SSRW is employed. Applicants have also determined that the desired threshold voltage for a pFET is difficult to achieve in cases in which a combination of two of a mid-gap work function gate stack, a SiGe channel and a SSRW is employed. Similar achievements can be made in the present disclosure for an nFET as well.

In one aspect of the present disclosure, the semiconductor structure includes a semiconductor substrate having a well region located within an upper region thereof. A semiconductor material stack is located on the well region. The semiconductor material stack includes, from bottom to top, a semiconductor-containing buffer layer and a non-doped semiconductor-containing channel layer; the semiconductor-containing buffer layer of the semiconductor material stack is located directly on an upper surface of the well region. The structure also includes a gate material stack located directly on an upper surface of the non-doped semiconductor-containing channel layer. The gate material stack employed in the present disclosure includes, from bottom to top, a high k gate dielectric layer, a work function metal layer and a polysilicon layer.

In the present disclosure, the buffer layer can be undoped silicon layer for a SiGe-channel pFET, or a SiC layer for a Si-channel nFET or a SiGe-channel pFET. In case of a SiC buffer layer, it can be either doped or undoped. The purpose of the buffer layer is to prevent/reduce diffusion of impurity atoms from the well into the undoped semiconductor-containing channel layer.

In another embodiment of the present disclosure, a semiconductor structure is provided that includes a semiconductor substrate having at least one pFET device region and at least one nFET device region located therein. The at least one pFET device region includes an n-well region located within an upper region of the semiconductor substrate, a first semiconductor material stack comprising, from bottom to top, a first semiconductor-containing buffer layer and a first non-doped semiconductor-containing channel layer, wherein the first semiconductor-containing buffer layer of the first semiconductor material stack is located directly on an upper surface of the n-well region, and a pFET gate material stack located directly on an upper surface of the first non-doped semiconductor-containing channel layer, wherein the pFET gate material stack comprises, from bottom to top, a first high k gate dielectric layer, a pFET work function metal layer and a first polysilicon layer. The at least one nFET device region includes a p-well region located within another upper region of the semiconductor substrate, a second semiconductor material stack comprising, from bottom to top, a second semiconductor-containing buffer layer and a second non-doped semiconductor-containing channel layer, wherein the second semiconductor-containing buffer layer of the second semiconductor material stack is located directly on an upper surface of the p-well region, and an nFET gate material stack located directly on an upper surface of the second non-doped semiconductor-containing channel layer, wherein the nFET gate material stack comprises, from bottom to top, a second high k gate dielectric layer, an nFET work function metal layer and a second polysilicon layer.

In addition to the above described structures, the present application also provides a method of fabricating the same. The method that is provided herein includes providing a semiconductor substrate having a well region located within an upper region thereof. A semiconductor material stack is formed atop the well region. The semiconductor material stack that is formed comprises, from bottom to top, a semiconductor-containing buffer layer and a non-doped semiconductor-containing channel layer, wherein the semiconductor-containing buffer layer of the semiconductor material stack is located directly on an upper surface of the well region. A gate material stack is formed directly on an upper surface of the non-doped semiconductor-containing channel layer. The gate material stack comprises, from bottom to top, a high k gate dielectric layer, a work function metal layer and a polysilicon layer.

DETAILED DESCRIPTION

The present disclosure, which provides a semiconductor structure including at least one field effect transistor (FET) having a high k/metal gate stack located on a semiconductor substrate, wherein the at least one FET has a desired threshold voltage value, improved short channel control, improved inversion carrier mobility and reduced external resistance, and a method of fabricating the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
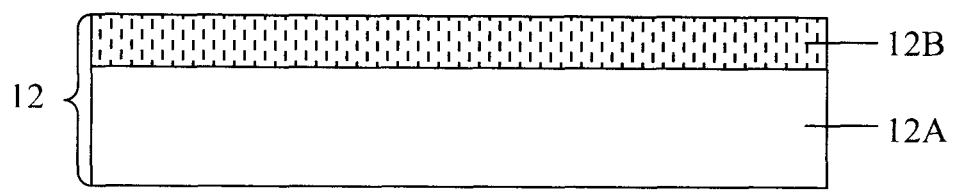
FIG. 1 is a pictorial representation (through a cross sectional view) depicting an initial structure including a semiconductor substrate having a well region located within an upper region of the semiconductor substrate.

Referring to FIG. 1, there is illustrated an initial structure 10 that can be employed in accordance with an embodiment of the present disclosure. The initial structure 10 shown in FIG. 1 includes a semiconductor substrate 12 having a well region 12B located within an upper region of the semiconductor substrate 12. The well region 12B is present atop a lower region 12A of the semiconductor substrate 12 that is comprised of a semiconductor material.

The semiconductor substrate 12 (minus the well region 12B) that can be employed in the present disclosure may include a bulk substrate, a semiconductor-on-insulator (SOI) substrate, or a hybrid orientation semiconductor substrate.

When a bulk semiconductor substrate is employed as semiconductor substrate 12, the bulk semiconductor substrate is comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the bulk semiconductor substrate is comprised of Si.

When an SOI substrate is employed as semiconductor substrate 12, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of Si.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some other embodiments, hybrid semiconductor substrates which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

After selecting the type of substrate to be employed, the well region 12B is formed in an upper region of the semiconductor substrate 12. The well region 12B can be formed by one of ion implantation, gas phase doping, and out-diffusion from a sacrificial layer including a dopant that is formed on the substrate and removed after the out-diffusion process. In one embodiment, ion implantation is employed in forming the well region.

The well region 12B that is formed in the present disclosure can include an n-type dopant (i.e., an element from Group VA of the Periodic Table of Elements such as, for example P and As) or a p-type dopant (i.e, an element from Group IIIA of the Periodic Table of Elements such as, for example, B, Al, and In). The type of dopant that is present in the well region 12B depends on the type of device being fabricated thereon. For example, and when a pFET device is being formed above the well region 12B, an n-type dopant is incorporated in the upper region of semiconductor substrate 12. In another example, and when an nFET device is being formed above the well region 12B, a p-type dopant is incorporated in the upper region of semiconductor substrate 12.

The well region 12B that is formed within the upper region of the semiconductor substrate 12 has a doping concentration that is from $1 \times 10^{18}$ atoms/cm$^3$ or greater. More particularly, the well region 12B that is formed within the upper region of the semiconductor substrate 12 has a doping concentration that is from $5 \times 10^{18}$ to $2 \times 10^{19}$ atoms/cm$^3$. In some embodiments of the present disclosure, an anneal process can be applied after well implantation to repair the crystal damage before the epitaxy process to grow the semiconductor-containing buffer layer and non-doped semiconductor-containing channel layer.

In some embodiments of the present disclosure, an isolation region can be formed into the semiconductor substrate 12 at this point of the process, or before the formation of well regions.

In another embodiment of the present disclosure, the isolation region can be formed into the structure after forming the semiconductor material stack atop substrate 12. The latter approach can result in better semiconductor material stack quality since the semiconductor material stack is grown epitaxially on a uniform well region not interrupted by an isolation region. For clarity, the at least one isolation region is not shown in FIGS. 1-6 of the present disclosure.

Figure 7:
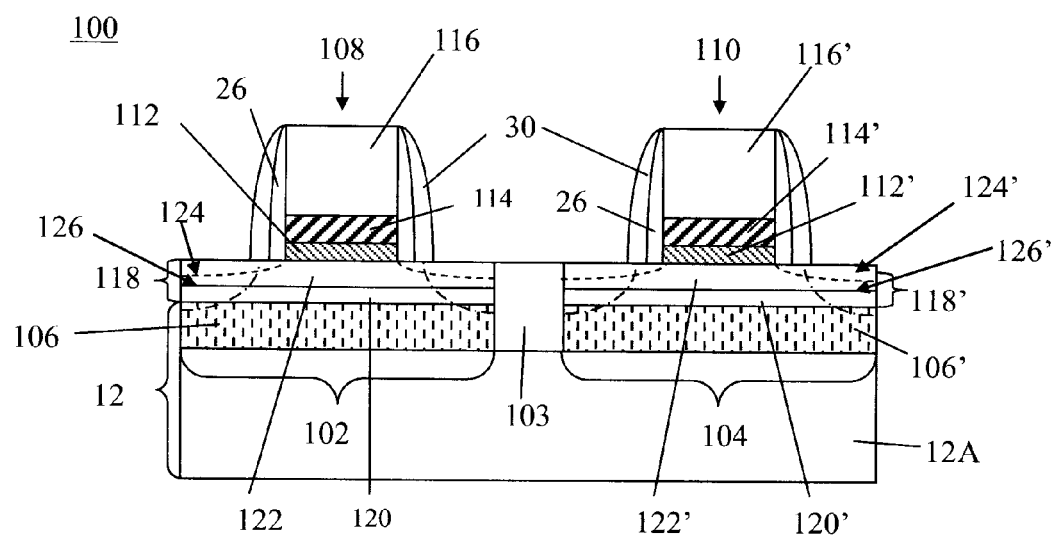
FIG. 7 is a pictorial representation (through a cross sectional view) depicting a CMOS structure that can be formed utilizing the basic processing steps mentioned above in FIGS. 1-6 together with block mask technology.

Notwithstanding when the isolation region is formed, the at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate regions, typically required when the neighboring gates have opposite conductivities, i.e., nFETs and pFETs. As such, the at least one isolation region separates an nFET device region from a pFET device region. FIG. 7, to be described in more detail below, shows a structure including isolation region 103 therein.

Figure 2:
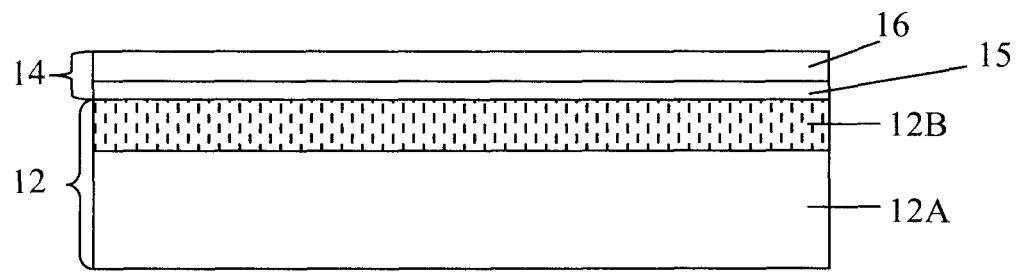
FIG. 2 is a pictorial representation (through a cross sectional view) depicting the initial structure of FIG. 1 after forming a semiconductor material stack including, from bottom to top, a semiconductor-containing buffer layer and an undoped semiconductor-containing channel layer located atop the well region of the semiconductor substrate.

Referring to FIG. 2, there is shown the structure of FIG. 1 after forming a semiconductor material stack 14 atop the well region 12B of the semiconductor substrate 12. The semiconductor material stack 14 includes, from bottom to top, a semiconductor-containing buffer layer 15 and a non-doped semiconductor-containing channel layer 16. As shown, the semiconductor-containing buffer layer 15 is located on and is in direct contact with an upper surface of the well region 12B, while the non-doped semiconductor-containing channel layer 16 is located on and is in direct contact with an upper surface of the semiconductor-containing buffer layer 15.

Since the semiconductor material stack consists of non-doped semiconductor-containing channel layer 16 and the well region 12B is heavily doped, the well region 12B mentioned above can be referred to as a super steep retrograded well (SSRW) since there exists a dopant profile in which the dopant concentration is high in the well region 12B and decreases to a low dopant concentration in the non-doped semiconductor-containing channel layer 16. Also, the change in dopant concentration is very abrupt across the thin semiconductor-containing buffer layer. By "abrupt" it is meant a dopant gradient steeper than 5 nm per decade.

The semiconductor-containing buffer layer 15 that is employed is any semiconductor material that retards the diffusion of dopant from well region 12B into the non-doped semiconductor-containing channel layer 16. As such, the semiconductor-containing buffer layer 15 may also be referred to herein as a dopant diffusion barrier, i.e., a semiconductor-containing barrier layer. The type of semiconductor material that is employed thus varies and is dependent on the type of dopant, i.e., n-type dopant or p-type dopant that is present in the well region 12B.

In one embodiment and when a pFET device is to be formed and the well region 12B includes an n-type dopant such as arsenic, non-doped silicon (Si) can be used as the semiconductor-containing buffer layer 15. In another embodiment and when an nFET device is to be formed and the well region 12B includes a p-type dopant such as boron, silicon carbide (SiC) can be used as the semiconductor-containing buffer layer 15. The SiC buffer layer can be undoped or doped with p-type dopants. In one embodiment, the p-type dopants can be introduced into the buffer layer in-situ during the epitaxial growth process. In another embodiment, the p-type dopants can be introduced after epitaxially growing the semiconductor-containing buffer layer 15 utilizing techniques such as ion implantation and/or gas phase doping, that are well known to those skilled in the art. The p-type dopant concentration within the SiC buffer layer is typically from 5E18 atoms/cm$^3$ to 2E19 atoms/cm$^3$.

In embodiments in which SiC is employed as the semiconductor-containing buffer layer 15, the atomic concentration of carbon in the silicon carbide alloy can be a constant number between 0.1% and 5%, and typically from 0.5% to 2%. Alternately, the atomic concentration of carbon in the silicon carbide alloy can be graded vertically.

The semiconductor-containing buffer layer 15 is formed utilizing any conventional epitaxial growth process in which any well known semiconductor-containing precursor can be employed. Since epitaxy is employed in forming the semiconductor-containing buffer layer 15, layer 15 is a single crystalline semiconductor material having the same crystal orientation as that of the underlying substrate 12. The thickness of the semiconductor-containing buffer layer 15 is typically from 2 nm to 20 nm, with a thickness from 5 nm to 10 nm being more typical. Other thicknesses can also be employed as long as the semiconductor-containing buffer layer 15 maintains its ability to retard diffusion of dopants from the underlying well region 12B into the non-doped semiconductor-containing channel layer 16.

The non-doped semiconductor-containing channel layer 16 that is employed is any semiconductor material that can function as a device channel and aid in tuning the threshold voltage of the device to be formed thereon. The type of semiconductor material that is employed as the non-doped semiconductor-containing channel layer 16 thus varies. In one embodiment and when a pFET device is to be formed, a silicon germanium (SiGe) alloy can be used as the non-doped semiconductor-containing channel layer 16. In another embodiment and when an nFET device is formed to be formed, silicon (Si) can be used as the non-doped semiconductor-containing channel layer 16.

The non-doped semiconductor-containing channel layer 16 is formed utilizing any conventional epitaxial growth process in which any well known semiconductor-containing precursor can be employed. Since epitaxy is employed in forming the non-doped semiconductor-containing channel layer 16, layer 16 is a single crystalline semiconductor material having the same crystal orientation as that of the underlying substrate 12. The thickness of the non-doped semiconductor-containing channel layer 16 is typically from 2 nm to 20 nm, with a thickness from 5 nm to 10 nm being more typical. Other thicknesses can also be employed in the present disclosure.

In embodiments in which SiGe is employed as the non-doped semiconductor-containing channel layer 16, the atomic concentration of germanium in the silicon germanium alloy can be a constant number between 20% and 50%, and typically from 30% to 40%. Alternately, the atomic concentration of germanium in the silicon germanium alloy can be graded vertically. For example, the atomic concentration of germanium in the silicon germanium alloy layer can gradually increase with distance from the interface between the semiconductor-containing buffer layer 15 and the silicon germanium alloy, reach a peak that may, or may not, include a plateau, and then decrease with distance from the interface between the semiconductor-containing buffer layer 15 once the distance increases beyond the peak and/or the plateau. The thickness and the germanium atomic concentration profile, whether the germanium atomic concentration profile is constant or graded, are selected such that the entirety of the non-doped semiconductor-containing channel layer 16 remains single crystalline, and defect density caused by strain relaxation is at a negligible level, i.e., is not significant enough to adversely impact charge carrier mobility in the semiconductor material stack 14, and especially in the non-doped semiconductor-containing channel layer 16.

Figure 3:
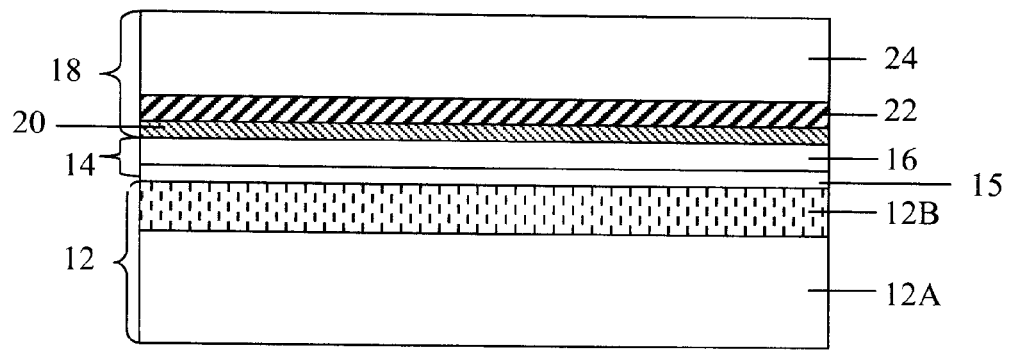
FIG. 3 is a pictorial representation (through a cross sectional view) depicting the structure of FIG. 2 after forming a gate material stack on an upper surface of the semiconductor material stack.

Referring to FIG. 3, there is shown the structure of FIG. 2 after forming a gate material stack 18 on an upper surface of the semiconductor material stack 14, i.e., atop the non-doped semiconductor-containing channel layer 16. The gate material stack 18 includes, from bottom to top, a high k gate dielectric layer 20, a work function metal layer 22 and a polysilicon layer 24.

The high k gate dielectric layer 20 of the gate material stack 18 includes any dielectric material having a dielectric constant that is greater than the dielectric constant of silicon oxide, e.g., 3.9. Typically, the high k gate dielectric layer 20 has a dielectric constant greater than 4.0, with a dielectric constant of greater than 8.0 being even more typical. Exemplary high k dielectric materials that can be used as the high k gate dielectric layer 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. In one embodiment, a Hf-containing high k material such as $HfO_2$ is employed as the high k gate dielectric layer 20. Multilayered stacks of these high k materials can also be employed as the high k gate dielectric layer 20. Each value of x is independently from 0.5 to 3 and each value of y is independently from 0 to 2.

The thickness of the high k gate dielectric layer 20 may vary depending on the technique used to form the same. Typically, however, the high k gate dielectric layer 20 has a thickness from 0.5 nm to 10 nm, with a thickness from 1.0 nm to 5 nm being even more typical. The high k gate dielectric layer 20 employed may have an effective oxide thickness on the order of, or less than, 1 nm.

The high k gate dielectric layer 20 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

The work function metal layer 22 includes a metal, which has a work function. The metal of the work function metal layer 22 is selected to optimize the performance of a transistor to be subsequently formed. In one embodiment, the work function metal layer 44 includes a silicon valence band edge metal such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. For example, the work function metal layer 22 can be a layer of TiN. Such work function metals are typically suitable for use with pFET devices.

In another embodiment, the work function metal layer 22 includes a silicon conduction band edge metal such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV. For example, the work function metal layer 22 can be a layer of TiAl. Such work function metals are typically suitable for use with nFET devices.

The work function metal layer 22 can be formed, for example, by physical vapor deposition, chemical vapor deposition, or atomic layer deposition (ALD). Typically, the thickness of the work function metal layer 22 is from 1 nm to 30 nm, with a thickness from 2 nm to 10 nm being more typical.

The polysilicon layer 24 can be formed utilizing any conventional deposition process including, for example, chemical vapor deposition, plasma enhanced chemical vapor deposition, chemical solution deposition and evaporation. The polysilicon layer 24 can be doped in-situ during the deposition process itself. Alternatively, a dopant can be introduced into the polysilicon layer after deposition of the polysilicon layer by ion implantation or gas phase doping. The thickness of the polysilicon layer 24 can vary depending on the technique used in forming the same. Typically, the polysilicon layer 24 has a thickness from 10 nm to 100 nm, with a thickness from 20 nm to 50 nm being more typical.

Figure 4:
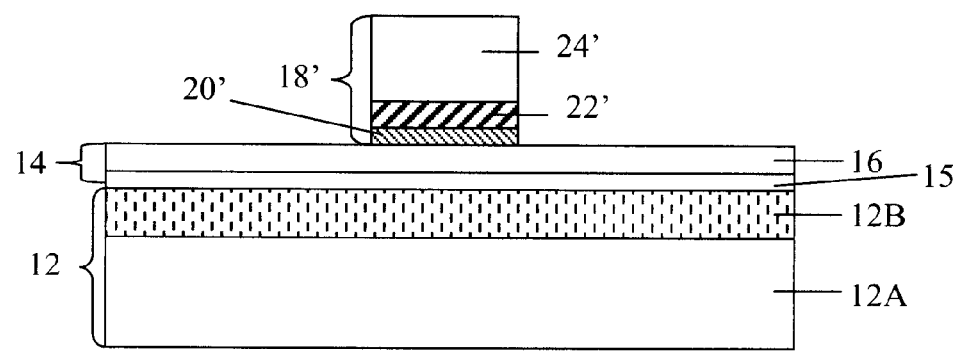
FIG. 4 is a pictorial representation (through a cross sectional view) depicting the structure of FIG. 3 after patterning the gate material stack to provide at least one patterned gate stack on the semiconductor material stack.

Referring to FIG. 4, there is shown the structure of FIG. 3 after patterning the gate material stack 18 to provide at least one patterned gate stack 18' on the semiconductor material stack 14. Although the drawings illustrate the formation of a single patterned gate stack, the present disclosure can also be employed when a plurality of patterned gate stacks are formed.

The patterning of the gate material stack 18 includes lithography and etching. The lithography step includes first providing a photoresist (not shown) atop the upper surface of the gate material stack 18, i.e., atop the upper surface of polysilicon layer 24. The photoresist can include a positive-tone photoresist material, a negative-tone photoresist material or a hybrid photoresist material, each of which is well known to those skilled in the art. The photoresist can be formed utilizing any conventional resist deposition process such as, for example, spin-on coating, spray coating or evaporation. After applying the photoresist on an upper surface of the gate material stack 18, the photoresist is exposed to a desired pattern of radiation and thereafter the exposed resist is developed utilizing a conventional resist developer. This results in a patterned photoresist (not shown) atop the gate material stack 18. The patterned photoresist protects some underlying portions of the gate material stack 18, while leaving other underlying portions of the gate material stack 18 exposed. The exposed portions of the underlying gate material stack 18 are then etched utilizing dry etching, wet etching or a combination thereof. Dry etching includes reactive ion etching, plasma etching, ion beam etching or laser ablation. Wet etching includes a chemical etchant that selectively removes at least one of the layers of the gate material stack 18. The patterned resist can be removed anytime after the pattern has been transferred into one of the layers of the gate material stack 18 utilizing a conventional resist removal process such as, for example, ashing. Alternatively, the patterned resist can remaining atop the gate material stack during the removal of the exposed portions of the gate material stack 18 and be removed after completely removal of the exposed portions of the gate material stack 18 by a conventional resist removal process such as, for example, ashing. The etching, which may include a single etch or multiple etches, stops on an upper surface of the semiconductor material stack 14.

Figure 5:
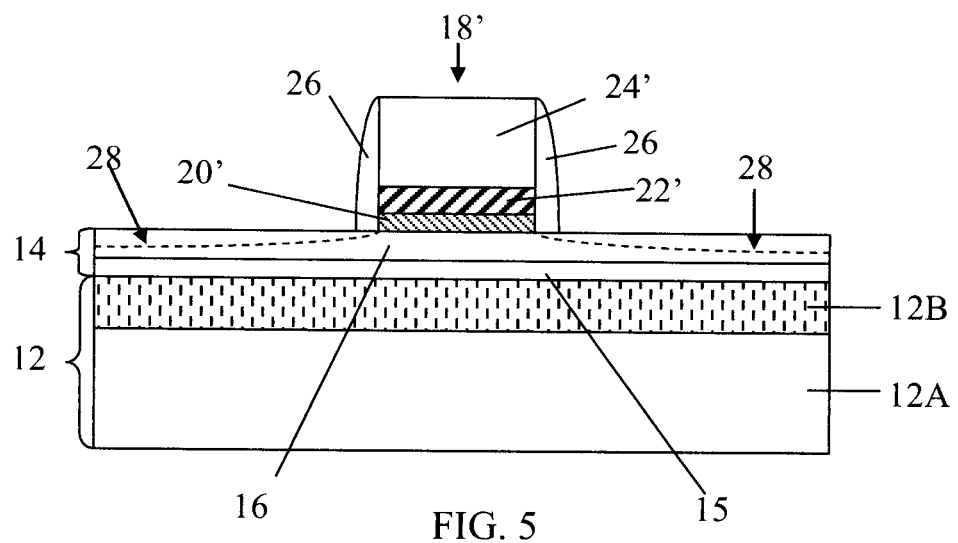
FIG. 5 is a pictorial representation (through a cross sectional view) depicting the structure of FIG. 4 after forming an inner spacer on sidewalls of the at least one patterned gate stack and after forming extension regions into the semiconductor material stack.

Referring to FIG. 5, there is depicted the structure of FIG. 4 after forming an inner spacer 26 on sidewalls of the at least one patterned gate stack 18' and after forming extension regions 28 into the semiconductor material stack 14. In some embodiments, the inner spacer 26 is omitted from the structure. When present, the inner spacer 26 is comprised of a dielectric material including for example, an oxide, a nitride, an oxynitride and multilayers thereof. In one embodiment, the inner spacer 26 is comprised of an oxide such as, for example, silicon oxide. In another embodiment, the inner spacer 26 is comprised of a nitride such as, for example, silicon nitride. The inner spacer 26 can be formed by deposition of a dielectric layer, followed by etching. Alternatively, the inner spacer 26 can be formed by a thermal process such as, for example, oxidation or nitridation. In some embodiments, a combination of the aforementioned processes can be used in forming inner spacer 26. The inner spacer 26 has a width, as measured from its base, that is typically from 3 nm to 20 nm, with a width from 5 nm to 10 nm being more typical.

The extension regions 28, which can also be referred to herein as source/drain extension regions, can be formed utilizing any known extension ion implantation process utilizing at least the patterned gate stack 18', and optionally the inner spacer 26, as an ion implantation mask. As such, the extension regions 28 are formed at the footprint of each patterned gate stack 18'. After the extension ion implantation, an anneal can be used to activate the implanted extension ions. In some embodiments, the activation of the extension regions 28 can be delayed until after the source/drain regions 32 are formed. The depth of the extension regions 28 may vary depending on the conditions of the ion implantation and the activation anneal employed. Typically, the extension regions 28 are formed in the semiconductor material stack 14 to a depth, as measured from an upper surface thereof, of from 5 nm to 20 nm.

Figure 6:
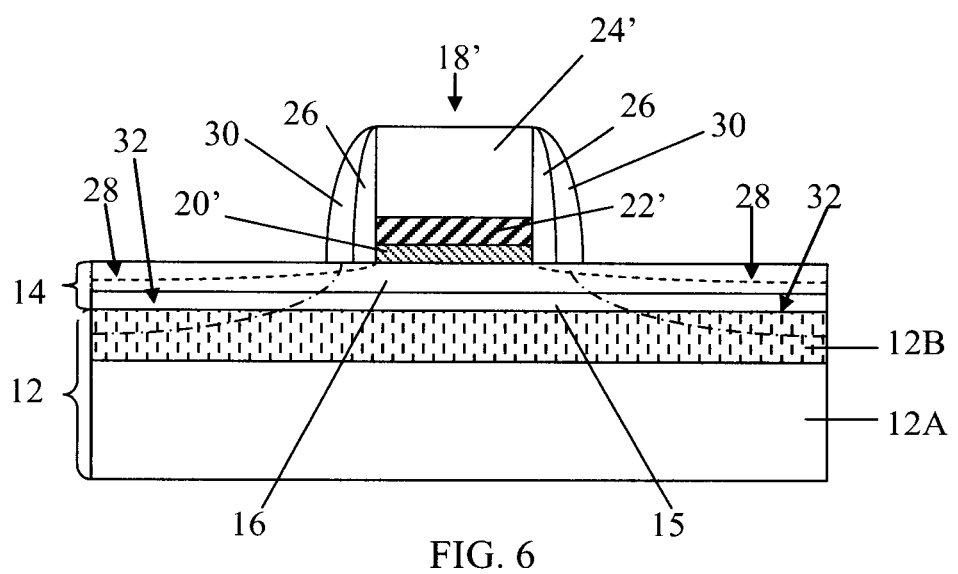
FIG. 6 is a pictorial representation (through a cross sectional view) depicting the structure of FIG. 5 after forming an outer spacer and after forming a source region and a drain region into the semiconductor material stack and an upper portion of the well region.

Referring to FIG. 6, there is shown the structure of FIG. 5 after forming an outer spacer 30 and after forming a source region and a drain region (collectively referred herein as source/drain regions 32) into the semiconductor material stack 14.

In some embodiments and as shown in FIG. 6, the outer spacer 30 can be formed adjoining the inner spacer 26. In other embodiments, the outer spacer 30 can be formed on the sidewalls of each patterned gate stack 18'. The outer spacer 30 can be comprised of a dielectric material including for example, an oxide, a nitride, an oxynitride and multilayers thereof. In one embodiment, the outer spacer 30 is comprised of an oxide such as, for example, silicon oxide. In another embodiment, the outer spacer 30 is comprised of a nitride such as, for example, silicon nitride. The outer spacer 30 is typically, but not necessarily always, composed of a different dielectric material than inner spacer 26. The outer spacer 30 can be formed by deposition of a dielectric layer, followed by etching. Alternatively, the outer spacer 30 can be formed by a thermal process such as, for example, oxidation or nitridation. In some embodiments, a combination of the aforementioned processes can be used in forming outer spacer 30. The outer spacer 30 typically has a width, as measured from its base, that is greater than the width of the inner spacer 26. Typically, the outer spacer 30 has a width from 10 nm to 50 nm, with a width from 15 nm to 30 nm being more typical.

The source/drain regions 32 can be formed utilizing any known source/drain ion implantation process utilizing at least the patterned gate stack 18', optionally the inner spacer 26, and the outer spacer 30 as an ion implantation mask. As such, the source/drain regions 32 are also formed at the footprint of each patterned gate stack 18'. After the source/drain ion implantation, an anneal can be used to activate the implanted dopant ions. The depth of the source/drain regions 32, which is much deeper than that of the extension regions 28, may vary depending on the conditions of the ion implantation and the activation anneal employed. Typically, the source/drain regions 32 are formed with the semiconductor material stack 14 and typically within an upper portion of the well region 12B. The depth of the source/drain regions 32 as measured from an upper surface of material stack 14 is typically from 20 nm to 100 nm.

In some embodiments, metal semiconductor alloy contacts can now be formed utilizing any process that is capable of forming a metal semiconductor alloy atop a semiconductor material stack 14. In one embodiment, the metal semiconductor alloy contacts can be formed utilizing a silicide process. The silicide process can be self-aligned to the outer edge of the outer spacer 30. The silicide process includes forming a metal capable of forming a metal semiconductor alloy when reacted with a semiconductor material. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned gate stack 18' during this step of the present disclosure.

In some embodiments of the present disclosure the above processing steps, together with conventional block mask technology can be used to form a CMOS structure 100 such as shown, for example, in FIG. 7. The structure 100 shown in FIG. 7 includes a semiconductor substrate 12 that has at least one pFET device region 102 and at least one nFET device region 104 that are separated by isolation region 103. The semiconductor substrate 12 includes a lower region 12A that is comprised of a semiconductor material and upper well regions. The well region within the at least one pFET device region 102 is labeled as 106, while the well region within the at least one nFET device region 104 is labeled as 106'. The well regions 106, 106' are fabricated as described above for well region 12B. It is noted that well region 106 within the at least one pFET device region 102 includes an n-type dopant, while the well region 106' within the at least one nFET device region 104 includes a p-type dopant therein. The well regions 106, 106' of different conductivities can be formed using block masks to selectively block one of the device regions while forming the well region in the other device region.

The structure 100 shown in FIG. 7 also includes at least one pFET 108 located within the at least one pFET device region 102, and at least one nFET 110 located within the at least one nFET device region 104.

Each FET, i.e, pFET 108 and nFET 110, includes a high k gate dielectric layer (labeled as 112 and 112'), a work function metal layer (labeled as 114 and 114'), and a polysilicon layer (labeled as 116 and 116'). The high gate dielectric layer 112 of the at least one pFET 108 can be the same or different as the high k gate dielectric layer 112' of the at least one nFET 110. Different high k gate dielectrics can be achieved using block mask technology. The high k gate dielectric layers 112, 112' can include one of the high k materials mentioned above for high k gate dielectric layer 20. Also, high k gate dielectric layers 112, 112' can be made and have a thickness as described above for high k gate dielectric layer 20.

The work function metal layer 114 contained in the at least one pFET 108 includes one of the work function metals mentioned above for work function metal layer 22 that is suitable for use with a pFET device. Likewise, the work function metal layer 114' contained in the at least one nFET includes one of the work function metals mentioned above for work function metal layer 22 that is suitable for use with an nFET device. Work function metal layers 114 and 114 can be formed utilizing one of the processes mentioned above for forming work function metal layer 22. Also, work function metal layers 114, 114' can have a thickness within the range mentioned above for work function metal layer 22. Again, block mask technology can be employed in forming work function metal layers 114, 114'.

Polysilicon layers 116, 116' can be formed and have a thickness as mentioned above for polysilicon layer 24. Polysilicon layer 116 can be the same as or different from polysilicon layer 116' in turns of the type of dopant that is present therein. For example, polysilicon layer 116 typically includes p-type dopants, while polysilicon layer 116' typically includes n-type dopants. Again, block mask technology can be employed in forming polysilicon layers 116, 116'. In other embodiments, polysilicon 116 and 116' can be both doped by p-type dopants or n-type dopants.

Each FET shown in FIG. 7 also includes inner spacers 26 and outer spacers 30 that are formed and include materials as mentioned above.

The at least one pFET 108 is located on a semiconductor material stack 118, while the at least one nFET 110 is located atop a semiconductor stack 118'. Semiconductor material stack 118 includes, from bottom to top, a non-doped semiconductor-containing (typically Si) buffer layer 120 and a non-doped semiconductor-containing (typically SiGe alloy) channel layer 122. The semiconductor material stack 118' includes, from bottom to top, a non-doped or doped semiconductor-containing (typically SiC) buffer layer 120' and a non-doped semiconductor-containing (typically Si) channel layer 122'. The semiconductor material stacks 118, 118' can be made using the same techniques as mentioned above in connection with semiconductor material stack 14.

The structure shown in FIG. 7 also includes source/drain extension regions 124, 124' and source/drain regions 126/126' which are formed using the same techniques as mentioned above for forming source/drain extension regions 24 and source/drain regions 32. The source/drain extension regions 124/124' and the source/drain regions 126/126' are doped appropriately for the type of device that is fabricated therein.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a semiconductor substrate having a well region located within an upper region thereof;
a semiconductor material stack comprising, from bottom to top, a semiconductor-containing buffer layer and a non-doped semiconductor-containing channel layer, wherein said semiconductor-containing buffer layer of said semiconductor material stack comprises a semiconductor material and is located directly on an upper surface of said well region; and
a gate material stack located directly on an upper surface of said non-doped semiconductor-containing channel layer, wherein said gate material stack comprises, from bottom to top, a high k gate dielectric layer, a work function metal layer and a polysilicon layer.

2. The semiconductor structure of claim 1 wherein said well region includes n-type dopants and has a dopant concentration of $5\times10^{18}$ atoms/cm$^3$ or greater.

3. The semiconductor structure of claim 2 wherein said semiconductor-containing buffer layer comprises non-doped Si, and said non-doped semiconductor-containing channel layer comprises a SiGe alloy.

4. The semiconductor structure of claim 3 wherein said work function metal layer is a pFET work function metal layer comprising a silicon valence band edge metal.

5. The semiconductor structure of claim 4 wherein said silicon valence band edge metal comprises Pt, Rh, Ir, Ru, Cu, Os, Be, Co, Pd, Te, Cr, Ni, TiN or alloys thereof.

6. The semiconductor structure of claim 1 wherein said well region includes p-type dopants and has a dopant concentration of $5\times10^{18}$ atoms/cm$^3$ or greater.

7. The semiconductor structure of claim 6 wherein said semiconductor-containing buffer layer comprises non-doped or p-type doped SiC, and said non-doped semiconductor-containing channel layer comprises Si.

8. The semiconductor structure of claim 7 wherein said work function metal layer is an nFET work function metal layer comprising a silicon conduction band edge metal.

9. The semiconductor structure of claim 8 wherein said silicon conduction band edge metal comprises Hf, Ti, Zr, Cd, La, Tl, Yb, Al, Ce, Eu, Li, Pb, Tb, Ni, In, Lu, Sm, V, Zr, Ga, Mg, Gd, TiAl or alloys thereof.

10. A semiconductor structure comprising:
a semiconductor substrate having an at least one pFET device region and at least one nFET device region located therein,
wherein said at least one pFET device region includes an n-well region located within an upper region of the semiconductor substrate, a first semiconductor material stack comprising, from bottom to top, a first non-doped semiconductor-containing buffer layer and a first non-doped semiconductor-containing channel layer, wherein said first non-doped semiconductor-containing buffer layer of said first semiconductor material stack comprises a semiconductor material and is located directly on an upper surface of said n-well region, and a pFET gate material stack located directly on an upper surface of said first non-doped semiconductor-containing channel layer, wherein said pFET gate material stack comprises, from bottom to top, a first high k gate dielectric layer, a pFET work function metal layer and a first polysilicon layer; and
wherein said at least one nFET device region includes a p-well region located within another upper region of the semiconductor substrate, a second semiconductor material stack comprising, from bottom to top, a second semiconductor-containing buffer layer and a second non-doped semiconductor-containing channel layer, wherein said second semiconductor-containing buffer layer of said second semiconductor material stack comprises another semiconductor material and is located directly on an upper surface of said p-well region, and an nFET gate material stack located directly on an upper surface of said second non-doped semiconductor-containing channel layer, wherein said nFET gate material stack comprises, from bottom to top, a second high k gate dielectric layer, an nFET work function metal layer and a second polysilicon layer.

11. The semiconductor structure of claim 10 wherein said n-well region includes n-type dopants and has a dopant concentration of $5\times10^{18}$ atoms/cm$^3$ or greater, and said p-well region includes p-type dopants and has a dopant concentration of $5\times10^{18}$ atoms/cm$^3$ or greater.

12. The semiconductor structure of claim 10 wherein said first non-doped semiconductor-containing buffer layer comprises Si, and said first non-doped semiconductor-containing channel layer comprises a SiGe alloy.

13. The semiconductor structure of claim 10 wherein said pFET work function metal layer comprises a silicon valence band edge metal.

14. The semiconductor structure of claim 13 wherein said silicon valence band edge metal comprises Pt, Rh, Ir, Ru, Cu, Os, Be, Co, Pd, Te, Cr, Ni, TiN or alloys thereof.

15. The semiconductor structure of claim 10 wherein said second semiconductor-containing buffer layer comprises non-doped or p-type doped SiC, and said second non-doped semiconductor-containing channel layer comprises Si.

16. The semiconductor structure of claim 10 wherein said nFET work function metal layer comprises a silicon conduction band edge metal.

17. The semiconductor structure of claim 16 wherein said silicon conduction band edge metal comprises Hf, Ti, Zr, Cd, La, Tl, Yb, Al, Ce, Eu, Li, Pb, Tb, Ni, In, Lu, Sm, V, Zr, Ga, Mg, Gd, TiAl and alloys thereof.

18. A method of fabricating a semiconductor structure, said method comprising:
providing a semiconductor substrate having a well region located within an upper region thereof;
forming a semiconductor material stack atop the well region, wherein said semiconductor material stack comprises, from bottom to top, a semiconductor-containing buffer layer and a non-doped semiconductor-containing channel layer, wherein said semiconductor-containing buffer layer of said semiconductor material stack comprises a semiconductor material and is located directly on an upper surface of said well region; and
forming a gate material stack directly on an upper surface of said non-doped semiconductor-containing channel layer, wherein said gate material stack comprises, from bottom to top, a high k gate dielectric layer, a work function metal layer and a polysilicon layer.

19. The method of claim 18 wherein said well region is formed by introducing n-type dopants at a concentration greater than $5\times10^{19}$ atoms/cm$^3$ within the upper region of the substrate.

20. The method of claim 19 wherein said forming the semiconductor material includes epitaxially growing a non-doped Si layer as said semiconductor-containing buffer layer, and epitaxially growing a SiGe alloy layer as said non-doped semiconductor-containing channel layer.

21. The method of claim 20 wherein said forming the gate material stack includes selecting and depositing a pFET work function metal layer as said work function metal layer, wherein said pFET work function metal layer is a silicon valence band edge metal.

22. The method of claim 18 wherein said well region is formed by introducing p-type dopants at a concentration greater than $5\times10^{18}$ atoms/cm$^3$ within the upper region of the substrate.

23. The method of claim 22 wherein said forming the semiconductor material includes epitaxially growing a non-doped or p-type doped SiC layer as said semiconductor-containing buffer layer, and epitaxially growing a Si layer as said non-doped semiconductor-containing channel layer.

24. The method of claim 23 wherein said forming the gate material stack includes selecting and depositing an nFET work function metal layer as said work function metal layer, wherein said nFET work function metal layer is a silicon conduction band edge metal.

25. The method of claim 19 further comprising:
- providing another well region located within an upper region of the semiconductor substrate;
- forming another semiconductor material stack atop the another well region, wherein said another semiconductor material stack comprises, from bottom to top, another semiconductor-containing buffer layer and another non-doped semiconductor-containing channel layer, wherein said another semiconductor-containing buffer layer of said another semiconductor material stack comprises another semiconductor material and is located directly on an upper surface of said another well region; and
- forming another gate material stack directly on an upper surface of said another non-doped semiconductor-containing channel layer, wherein said another gate material stack comprises, from bottom to top, another high k gate dielectric layer, another work function metal layer and another polysilicon layer.

* * * * *